United States Patent
Jeong (10) Patent No.: US 7,069,984 B2
(45) Date of Patent: Jul. 4, 2006

(54) MULTI-CHANNEL TEMPERATURE CONTROL SYSTEM FOR SEMICONDUCTOR PROCESSING FACILITIES

(75) Inventor: In Kwon Jeong, Sunnyvale, CA (US)

(73) Assignee: Oriol Inc., San Jose, CA (US)

( * ) Notice: Subject to any disclaimer, the term of this patent is extended or adjusted under 35 U.S.C. 154(b) by 0 days.

(21) Appl. No.: 09/780,713

(22) Filed: Feb. 8, 2001

(65) Prior Publication Data

US 2004/0182563 A1   Sep. 23, 2004

(51) Int. Cl.
*F25B 29/00* (2006.01)

(52) U.S. Cl. .................. 165/206; 62/209; 165/263; 165/264; 156/345

(58) Field of Classification Search .................. 165/205, 165/206, 263, 264; 62/209; 156/345; 219/201
See application file for complete search history.

(56) References Cited

U.S. PATENT DOCUMENTS

| | | | | |
|---|---|---|---|---|
| 3,735,805 A | * | 5/1973 | Stillhard | |
| 5,201,187 A | * | 4/1993 | Yoshikawa | |
| 5,269,146 A | * | 12/1993 | Kerner | |
| 5,348,076 A | * | 9/1994 | Asakawa | |
| 5,413,164 A | * | 5/1995 | Teshima et al. | |
| 5,535,818 A | * | 7/1996 | Fujisaki et al. | |
| 5,579,826 A | * | 12/1996 | Hamilton et al. | |
| 5,607,009 A | * | 3/1997 | Turner et al. | |
| 5,613,364 A | * | 3/1997 | Higgins | |
| 5,794,450 A | * | 8/1998 | Alexander | |
| 5,802,856 A | * | 9/1998 | Schaper et al. | |
| 5,823,005 A | * | 10/1998 | Alexander et al. | |
| 6,015,465 A | | 1/2000 | Kholodenko et al. | 118/719 |
| 6,026,896 A | * | 2/2000 | Hunter | |
| 6,091,060 A | * | 7/2000 | Getchel et al. | |
| 6,102,113 A | | 8/2000 | Cowans | 165/206 |
| 6,209,334 B1 | * | 4/2001 | Cowans et al. | |
| 6,308,776 B1 | * | 10/2001 | Sloan et al. | |
| 6,345,515 B1 | * | 2/2002 | Pautsch et al. | |
| 6,389,225 B1 | * | 5/2002 | Malinoski et al. | |

* cited by examiner

*Primary Examiner*—Liljana Ciric
(74) *Attorney, Agent, or Firm*—McKenna Long & Aldridge LLP (57) ABSTRACT

A temperature control system for multiple process components in a semiconductor processing facility includes a common cooling unit for controlling the temperature of a cooling fluid and multiple remote temperature control modules in fluid communications with the common cooling unit that separately control the temperature of the multiple process components. The remote temperature control modules are located near the process components and each remote temperature control module includes a circulation loop for the cooling fluid from the common cooling unit and a circulation loop for a heat transfer fluid that received from a process component. A heat exchanger within the remote temperature control module allows heat transfer between the heat transfer fluid and the cooling fluid, thereby cooling the process component. A heat source may also be included within the remote temperature control module to provide heat to the heat transfer fluid and to the process component.

20 Claims, 3 Drawing Sheets

MULTI-CHANNEL TEMPERATURE CONTROL SYSTEM FOR SEMICONDUCTOR PROCESSING FACILITIES

FIELD OF THE INVENTION

The invention relates to temperature control systems for semiconductor processing facilities, and more particularly to a multi-channel temperature control system.

BACKGROUND OF THE INVENTION

Many semiconductor fabrication processes are temperature sensitive and therefore temperature control within process tools is important to producing high yield wafers. Typical temperature control techniques applied in semiconductor fabrication facilities involve providing a separate temperature control system for each tool that needs temperature control. For example, each temperature control system may include its own refrigeration unit, its own heat exchanger, and its own refrigerant distribution system. The one temperature control system-per-tool approach to temperature control has a few drawbacks. One drawback to the one temperature control system-per-tool approach is that each of the individual temperature control systems includes its own, relatively small, refrigeration unit. Smaller refrigeration units are generally less energy efficient and less reliable than larger refrigeration systems. Another drawback to the one temperature control system-per-tool approach is that all of the separate temperature control systems take up a large amount of floor space in a fabrication facility. Because the cost per square foot of a semiconductor fabrication facility is extremely high, there is much incentive to minimize the footprint of temperature control systems.

One technique for providing temperature control to multiple process components in a semiconductor processing facility is disclosed in U.S. Pat. No. 6,102,113, issued to Cowans. Cowans discloses a multi-channel temperature control system that is completely contained within a compact mechanical frame. The multi-channel temperature control system utilizes a single refrigeration unit to provide cooling to multiple temperature control channels. Each temperature control channel includes an evaporator/heat exchanger within the compact mechanical frame that utilizes subcooled refrigerant from the common refrigeration unit to cool a heat transfer fluid. The heat transfer fluid is circulated between the evaporator/heat exchanger that is within the mechanical frame and a process tool in order to control the temperature within the tool. Although the temperature control system of Cowans works well to provide multiple temperature control channels within a minimum footprint, the heat transfer fluid that is actually used within the process tool for temperature control must be continuously circulated between the process tool and the evaporator/heat exchanger that is located within the mechanical frame. If the temperature control system is supporting multiple process tools within a fabrication facility, the heat transfer fluid for each tool must be pumped back and forth between the process tool and the tool-specific evaporator/heat exchanger that is located within the mechanical frame. As the distance between the process tools and the multi-channel temperature control system increases, the responsivity of the temperature control system decreases because it takes longer for the heat transfer fluid to travel from the evaporator/heat exchanger to the process tool. Additionally, as the distance between the process tool and the evaporator/heat exchanger increases, the accuracy of temperature control is less reliable because the heat transfer fluid is subjected to different ambient temperature conditions while it is circulated between the process tool and the evaporator/heat exchanger.

Another technique for providing temperature control to multiple process components in a semiconductor processing facility is disclosed in U.S. Pat. No. 6,026,896, issued to Hunter. Hunter discloses a multi-channel temperature control system that includes a common source of heated or chilled fluid that is distributed to multiple remote process tools. Each process tool has a temperature sensor for measuring the temperature of the process tool, a flow control valve for controlling the flow of the heated or chilled fluid to the process tool, and temperature control logic that adjusts fluid flow through the flow control valve in response to temperature measurements from the temperature sensor. Although the temperature control system of Hunter works well to provide individual temperature control for multiple channels from a single source of heated or chilled fluid, the heated or chilled fluid disclosed in Hunter is used to directly heat or cool the process tools. Because the heated or chilled fluid is used to directly heat or cool the process tools, the range of temperature control possible at all of the process tools is limited by the temperature of the heated or chilled fluid that is circulated through the process tools and the electrical characteristics of the heated or chilled fluid must be compatible with the process tools that are being heated or cooled. In order for the temperature control system to be effective, all of the process tools must have very similar temperature control needs. Additionally, if a process tool requires both a source of heating and a source of cooling, according to Hunter, two parallel fluid supply systems are provided. Although the two parallel fluid supply systems can provide sources of heating and cooling to the same process tool, the parallel supply system are costly.

In view of the above-identified problems with prior art temperature control systems, what is needed is a temperature control system that is accurate, responsive, energy efficient, and that has a relatively small footprint.

SUMMARY OF THE INVENTION

A temperature control system for multiple process components in a semiconductor processing facility includes a common cooling unit for controlling the temperature of a cooling fluid and multiple remote temperature control modules in fluid communications with the common cooling unit that separately control the temperature of the multiple process components. The remote temperature control modules are located near the process components and each remote temperature control module includes a circulation loop for the cooling fluid from the common cooling unit and a circulation loop for a heat transfer fluid that is received from a process component. A heat exchanger within the remote temperature control module allows heat to be transferred from the heat transfer fluid to the cooling fluid, thereby providing cooling to the process component. A heat source may also be included within the remote temperature control module to provide heat to the heat transfer fluid and therefore to the process component. Because the same cooling fluid is used by all of the remote temperature control modules, only a single refrigeration system is needed to provide temperature control to multiple process components. Additionally, because the remote temperature control modules are located close to the process tools, the amount of heat transfer fluid that is circulated between the process components and the source of cooling/heating is kept to a minimum.

In an embodiment, each of the remote temperature control modules includes a cooling fluid circulation loop, a heat transfer fluid circulation loop, a heat exchanger, a cooling fluid control valve, and temperature control logic. The cooling fluid circulation loop circulates the cooling fluid through the remote temperature control module and the cooling fluid circulation loop is in fluid communication with the cooling unit. The heat transfer fluid circulation loop circulates a heat transfer fluid through the remote temperature control module and the heat transfer fluid is in fluid communication with a process component of the semiconductor processing facility. The heat exchanger exchanges heat between the cooling fluid that is circulated in the cooling fluid circulation loop and the heat transfer fluid that is circulated in the heat transfer fluid circulation loop. The cooling fluid control valve controls the circulation of the cooling fluid through the cooling fluid circulation loop and the temperature control logic controls the cooling fluid control valve in response to temperature set point information and temperature feedback information related to the process component.

In an embodiment of the temperature control system, each of the remote temperature control modules includes a heat source in thermal communication with the heat transfer fluid for providing heat to the heat transfer fluid. In a further embodiment, the heat source is controlled by the temperature control logic in response to the temperature set point information and temperature feedback information related to the process component. In a further embodiment, the heat source is integrated with the heat exchanger. In a further embodiment, the heat exchanger includes a portion of the cooling fluid circulation loop, a portion of the heat transfer fluid circulation loop, and the heat source.

In another embodiment of the temperature control system, the cooling unit is physically separate from the remote temperature control modules. In a further embodiment, the cooling unit is located in a utility basement of the semiconductor processing facility. In another embodiment, the remote temperature control modules are located in a subfloor area of the semiconductor processing facility. In another embodiment, the remote temperature control modules are physically connected to process tools within the semiconductor processing facility.

In another embodiment of the temperature control system, the cooling unit is set to maintain the cooling fluid at a temperature that is related to the lowest set point temperature among all of the process components that are thermally influenced by the cooling fluid.

In another embodiment, a temperature control system for a process component of a semiconductor processing facility includes a remote temperature control module. The remote temperature control module includes a cooling fluid input for receiving cooling fluid from a cooling unit that serves multiple remote temperature control modules, a cooling fluid output for returning cooling fluid to the cooling unit that serves multiple remote temperature control modules, and a cooling fluid circulation loop for circulating the cooling fluid through the remote temperature control module. The remote temperature control module also includes a heat transfer fluid input for receiving heat transfer fluid from the process component, a heat transfer fluid output for returning the heat transfer fluid to the process component, and a heat transfer fluid circulation loop for circulating the heat transfer fluid through the remote temperature control module, the heat transfer fluid being in fluid communication with the process component of the semiconductor processing facility. Additionally, the remote temperature control module includes a heat exchanger for exchanging heat between the cooling fluid that is circulated in the cooling fluid circulation loop and the heat transfer fluid that is circulated in the heat transfer fluid circulation loop, a cooling fluid control valve for controlling the circulation of the cooling fluid through the cooling fluid circulation loop, and temperature control logic for controlling the cooling fluid control valve in response to temperature set point information and temperature feedback information related to the process component.

Other aspects and advantages of the present invention will become apparent from the following detailed description, taken in conjunction with the accompanying drawings, illustrating by way of example the principles of the invention.

DETAILED DESCRIPTION OF THE INVENTION

Figure 1:
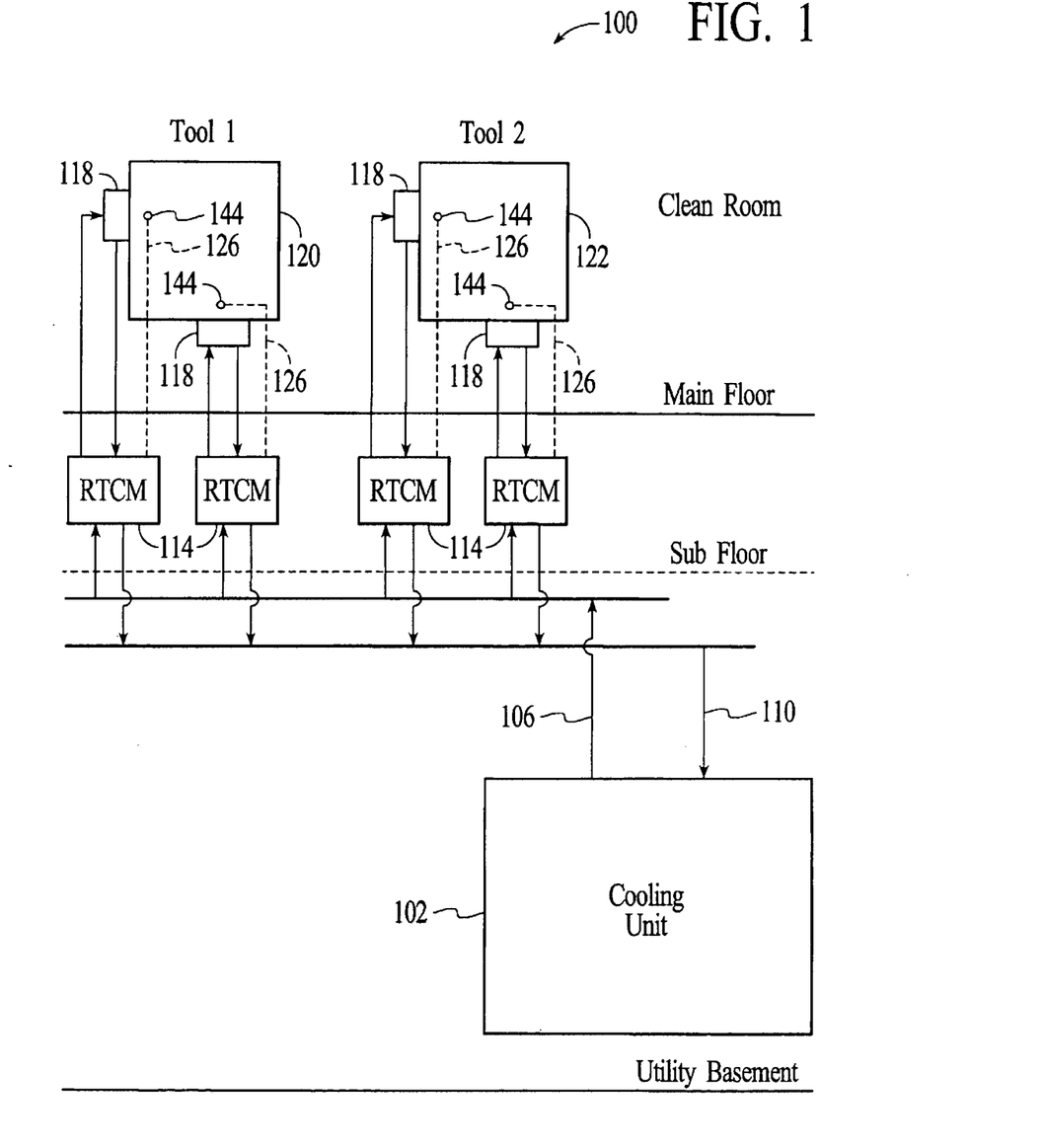
FIG. 1 depicts an embodiment of a multi-channel temperature control system that includes a common cooling unit and remote temperature control modules to control multiple separate process components at multiple different process tools in accordance with an embodiment of the invention.

FIG. 1 depicts an embodiment of a multi-channel temperature control system 100 that is used to control two separate process components at two different process tools. The multi-channel temperature control system includes a common cooling unit 102, a cooling fluid supply system 106, a cooling fluid return system 110, and one remote temperature control module 114 connected to each of the four process components 118 of the process tools 120 and 124.

In the embodiment of FIG. 1, the process tools 120 and 122 may include tools for carrying out many different semiconductor fabrication processes, such as chemical vapor deposition (CVD), dry etching, plasma etching, and copper deposition. Within a single process tool there may be different process components 118 that have different temperature control requirements. Example process components that need separate temperature control may include chamber walls, wafer chucks, support members, plasma sources, or any other process components that have temperature control requirements. Because a single processing tool may have more than one process component, temperature control is described herein in terms of process components. In the embodiment of FIG. 1, each process tool has two different process components and each process component has a component-specific temperature sensor 144 which feeds back temperature information, as indicated by the dashed lines 126, to the remote temperature control module 114 that is associated with the process component. In the embodiment of FIG. 1, the process tools are located on the main floor of a semiconductor processing facility, where the semiconductor processing facility includes the main floor, a subfloor just below the main floor, and a utility basement that is below the subfloor. Although only two process tools and four process components are described with reference to FIG. 1, the multi-channel temperature control system is applicable to any number of process tools and process components.

The common cooling unit 102 of the temperature control system provides cooling fluid to all of the remote temperature control modules 114. The common cooling unit distributes the cooling fluid to the remote temperature control modules through the cooling fluid supply system 106 and receives the cooling fluid from the remote temperature control modules through the cooling fluid return system 110. As shown in FIG. 1, the cooling unit is physically separate from the remote temperature control modules. Example cooling fluids include a fifty percent water and fifty percent glycol mixture. Although the cooling fluid contains many electrically conductive ions that could cause electrical grounding when used to control the temperature of direct current (DC) or radio frequency (RF) biased process components, the cooling fluid is only circulated through the remote temperature control modules and therefore does not present an electrical grounding problem to the process components. That is, because the cooling fluid is not in direct contact with a process component, the electrical characteristics of the cooling fluid are not a concern.

In the embodiment of FIG. 1, the common cooling unit is located in the utility basement below the main floor and the subfloor of the semiconductor processing facility. Locating the common cooling unit in the utility basement of a semiconductor processing facility is more economical than locating the common cooling unit on the main floor because floor space in the utility basement is much less expensive than clean room floor space. Locating the common cooling unit in the utility basement also eliminates the need for the common cooling unit to meet the particulate requirements of a clean room. Additionally, locating the common cooling unit in the utility basement provides easy access for maintenance activities. In an alternative embodiment, the common cooling unit may be located in places other than the utility basement. For example, the common cooling unit may be located outside of the semiconductor processing building, in places such as on the roof of the building or on a facilities pad near the building.

Figure 2:
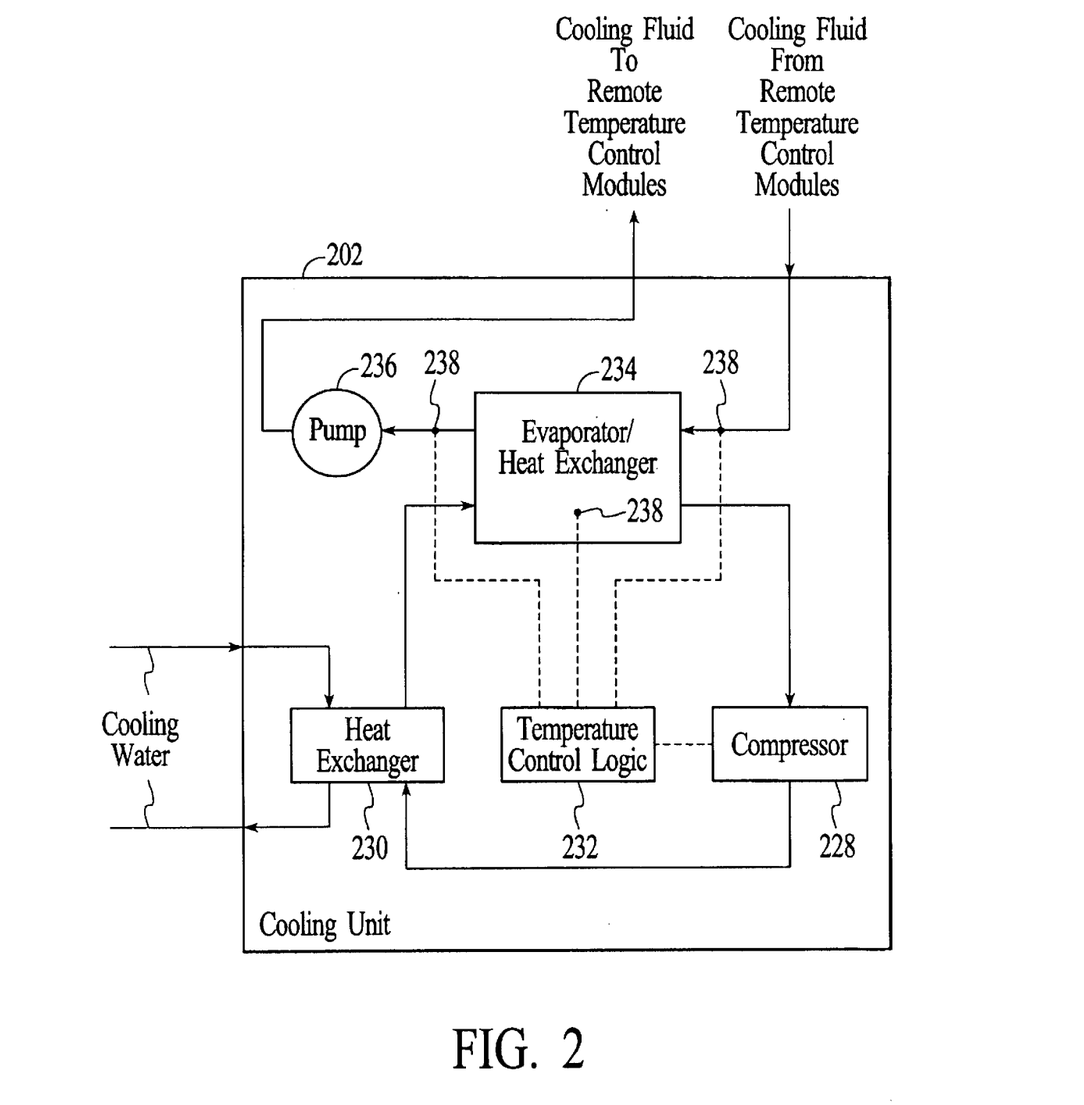
FIG. 2 is an expanded view of an embodiment of the common cooling unit shown in FIG. 1.

FIG. 2 is an expanded view of an embodiment of the common cooling unit 102 shown in FIG. 1. The common cooling unit 202 includes a compressor 228, a heat exchanger 230, temperature control logic 232, an evaporator/heat exchanger 234, and a pump 236. The compressor 228 compresses a refrigerant that is used to cool the cooling fluid. Referring to FIG. 2, compressed refrigerant is plumbed to the heat exchanger where the compressed refrigerant is condensed as is well known in industrial refrigeration systems. The compressed refrigerant is then plumbed to the evaporator/heat exchanger in order to provide cooling to the cooling fluid. As shown in FIG. 2, the cooling fluid received from the remote temperature control modules is circulated through the evaporator/heat exchanger for cooling and the cooled fluid is pumped back to the remote temperature control modules.

In an embodiment, the total cooling power of the compressor within the cooling unit ranges from a few kilowatts up to tens of kilowatts. In an embodiment, the temperature range of the cooling fluid may vary from minus fifty degrees Celsius to room temperature depending on the requirements of the process tools that are supported by the system. In an embodiment, the temperature of the cooling fluid is established by the channel, or channels, with the lowest temperature set point. That is, if one process component requires a set point temperature of minus twenty degrees Celsius, then the temperature of the cooling fluid is maintained at a temperature that allows a temperature of minus twenty degrees to be achieved at the process component. Process components that do not have as low of set point can restrict the flow of cooling fluid through the remote temperature control module and/or utilize heating within the remote temperature control module to meet their required set point temperature as is described in more detail below.

The temperature control logic 232 of the cooling unit can be used to adjust the temperature of the cooling fluid in response to temperature information from various temperature sensors 238. For example, temperature sensors may provide temperature information before the evaporator/heat exchanger 234, within the evaporator/heat exchanger, and/or after the evaporator/heat exchanger.

Although an embodiment of the cooling unit is described with reference to FIG. 2, other embodiments of the cooling unit may be used to provide cooling fluid to the remote temperature control modules to the remote temperature control modules. Regardless of the type of cooling unit that is used to provide the cooling fluid, the cooling unit is sized to meet the maximum cooling requirements of all process components that are expected to be run simultaneously. Because the cooling unit serves multiple process components, a larger, more reliable and energy efficient, compressor is used to provide cooling to the multiple process components.

Referring back to FIG. 1, the cooling fluid supply and return systems 106 and 110 carry the cooling fluid to and from the remote temperature control modules 114. In an embodiment, the cooling fluid supply and return systems include double walled and insulated pipes to carry the cooling fluid to and from the remote temperature control modules. Manual shut-off valves and flexible hoses may be used over relatively short distances to interface between the double walled pipes and the remote temperature control modules. In an embodiment, a pressure differential is created between the cooling fluid supply and return systems to induce flow of the cooling fluid.

Each process component 118 has a component-specific remote temperature control module 114. The remote temperature control modules utilize the cooling fluid from the common cooling unit 102 and the temperature feedback from component-specific temperature sensors 144 to control the temperature of heat transfer fluid that is circulated between the process components and the remote temperature control modules. In the embodiment of FIG. 1, the remote temperature control modules 114 are located in the subfloor area below the processing tools. That is, the remote temperature control modules are physically separate from the process components that they support. Locating the temperature control modules in the subfloor area enables the remote temperature control modules to be close to the process components without taking up expensive clean room space. In addition, locating the remote temperature control modules in the subfloor area reduces the potential of contaminating the clean room. In alternative embodiments, a remote temperature control module may be integrated into the frame of a process tool or located on the main floor of the facility in close proximity to the tool.

Figure 3:
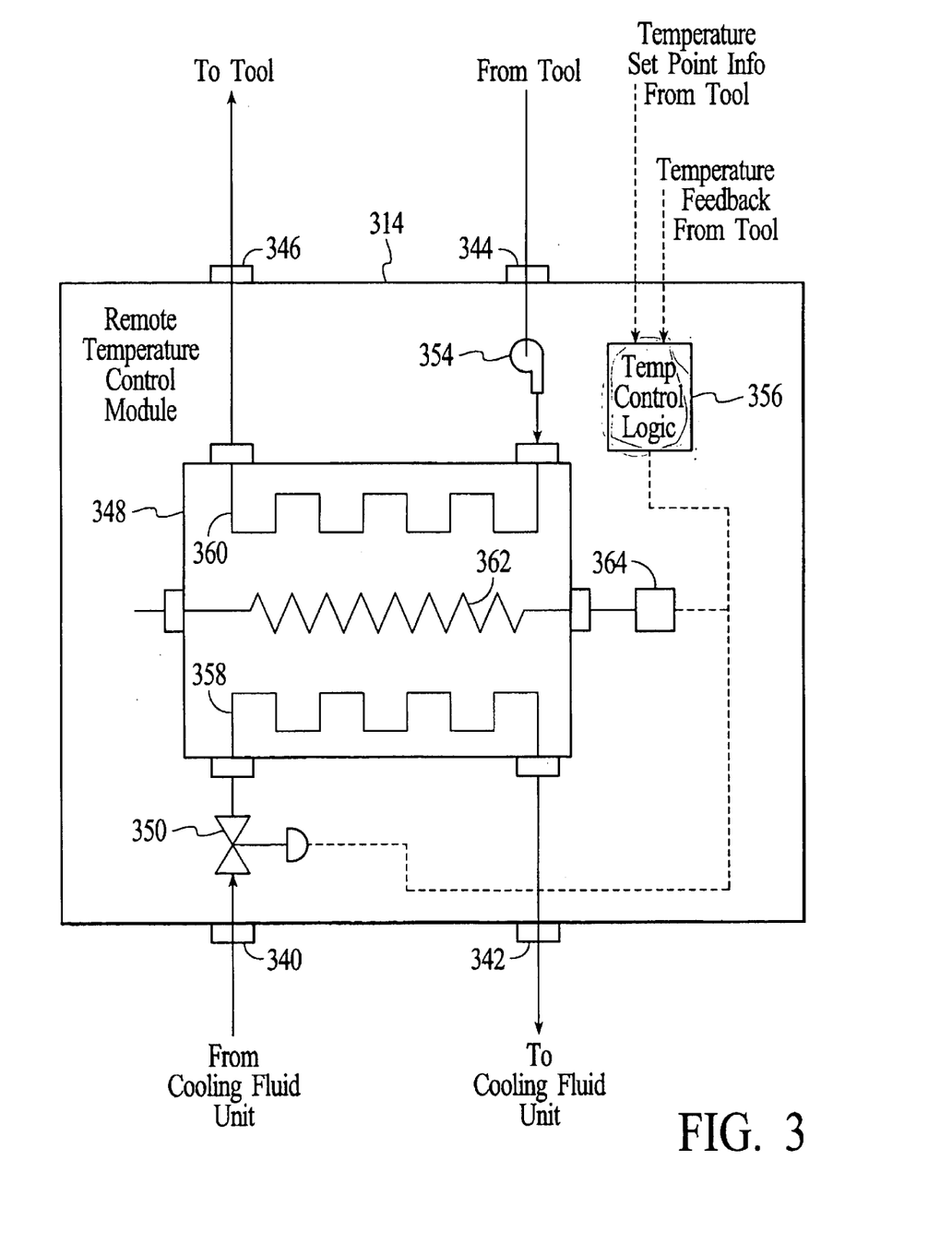
FIG. 3 is an expanded view of an embodiment of one of the remote temperature control modules shown in FIG. 1.

FIG. 3 is an expanded view of an embodiment of a remote temperature control module. The remote temperature control module 314 includes a cooling fluid input 340, a cooling fluid output 342, a heat transfer fluid input 344, a heat transfer fluid output 346, an integrated heat exchanger 348, a cooling fluid flow control valve 350, a heat transfer fluid pump 354, and temperature control logic 356. The integrated heat exchanger includes conduits 358 and 360 that are part of respective cooling fluid and heat transfer fluid circulation loops that exist within the remote temperature control module. The cooling fluid and the heat transfer fluid conduits within the integrated heat exchanger enable heat to be transferred from the heat transfer fluid to the cooling fluid and therefore away from the process component. The cooling fluid flow control valve controls the flow of cooling fluid through the heat exchanger. The cooling fluid flow control valve is located on the input side of the heat exchanger although in another embodiment, the cooling fluid flow control valve is located on the output side of the heat exchanger. A heat source 362 is integrated into the heat exchanger so that heat can be added to the heat transfer fluid to heat the process component. In other embodiments, the heat source may be integrated at some other point within the remote temperature control module, such as with a portion of the heat transfer fluid circulation loop that is outside of the heat exchanger 348. Although the heat source is included in FIG. 3, other embodiments of the remote temperature control module may not include a heat source.

In an embodiment, the heat source is an electrical heating system that is integrated with the heat exchanger. In an embodiment, a resistive electrical heater is integrated with the heat exchanger by vulcanizing the heater to an external surface of the heat exchanger. Integrating a heat source into the remote temperature control module enables the remote temperature control module to have a wide dynamic temperature range with a single fluid flow system. That is, only one fluid distribution system is required to achieve a dynamic temperature range that is set on the low end by the temperature of the cooling fluid and on the high end by the heating power of the heat source. In contrast, other known temperature control systems require separate cooling fluid and heating fluid distribution systems to achieve temperature control across a similar temperature range.

The heat transfer fluid pump 354 is included with the remote temperature control module 314 to pump the heat transfer fluid through the heat exchanger 348. In other embodiments, the heat transfer fluid pump may be external to the remote temperature control module and/or may be integrated with the respective process component.

In an embodiment, the heat transfer fluid that circulates through the remote temperature control module and the related process component is a fifty percent de-ionized (DI) water and fifty percent glycol mixture. In a preferred embodiment, the heat transfer fluid has specific characteristics, such as high resistivity and heat capacity, which make it a good fluid for use within the process components. Specifically, high resistivity is an important characteristic of the heat transfer fluid because common process components, such as plasma targets, have high DC or RF biasing, which can be negatively effected (i.e., causing electrical grounding) by a heat transfer fluid with low resistivity. A non-DI water/glycol mixture, such as the cooling fluid used in the common cooling unit, does not exhibit the necessary resistivity to be used on electrically biases process components. Other heat transfer fluids that exhibit the desired heat transfer fluid characteristics include, for example, a fluorinated fluid such as GALDEN™ or a perfluorinated fluid such as FLUORINERT™. Heat transfer fluids such as DI water/glycol mixtures, GALDEN™ and FLUORINERT™ are relatively expensive fluids in comparison to the cooling fluid that is used in the common cooling unit, however, because the remote temperature control modules are located at or near the process components, the amount of heat transfer fluid needed in circulation can be kept to a minimum. Although the heat transfer fluid works well within the process components, it is not economical to circulate large volumes of the heat transfer fluid throughout a large scale multi-channel temperature control system, such as the volume of cooling fluid that is required to supply cooling to multiple process tools from a single cooling unit.

The temperature control logic 356 controls the operation of the cooling fluid flow control valve 350 and the heat source 362. The temperature control logic receives temperature set point information from the respective process tool and temperature measurement information from the temperature sensor that is located within the process component of the tool. The temperature control logic uses the set point information from the tool and the temperature measurement information from the sensor to determine how to adjust the cooling fluid flow control valve and the heat source.

In an embodiment, CPU-based control logic manipulates the cooling or heating of the heat transfer fluid in accordance with proportional-integrated-derivative (PID) logic to provide the desired temperature control. In an embodiment, the process tool can feed future temperature set point information to the temperature control logic so that the temperature control logic can act in anticipation of future temperature control needs instead of purely reacting to current temperature measurements. In another embodiment, the process control logic is programmed to adjust automatically to a repeatable dynamic heat load cycle so that temperature deviations can be eliminated from one process cycle to another process cycle.

In operation, the common cooling unit 102 and 202 shown in FIGS. 1 and 2 provides a constant source of cooling fluid to the remote temperature control modules 114 and 314. Each remote temperature control module operates independently of the other remote temperature control modules and receives temperature set point information for its respective process component 118 from the respective process tool. Referring to process component 118 of tool 1 for example purposes, the temperature control logic 356 of the remote temperature control module receives temperature measurements from the component-specific temperature sensor 144 and temperature set point information from the tool. The temperature control logic uses the temperature measurements and temperature set point information to determine whether to provide cooling or heating to the heat transfer fluid that is circulating between the remote temperature control module and the process component.

If cooling of the heat transfer fluid is needed, the cooling fluid flow control valve 350 is opened and/or adjusted, allowing the cooling fluid to cool the heat transfer fluid. In an embodiment, the time that the flow control valve is opened and the flow rate allowed by the control valve are proportional to the difference in temperature between the set point and the actual temperature measured at the temperature sensor. The cooled heat transfer fluid is circulated between the process component and the remote temperature control module in order to cool the process component to the set point temperature.

If heating of the heat transfer fluid is needed, the heat source 362 is activated by, for example, providing electrical current flow through a resistive heater coil. In the embodiment of FIG. 3, the heat source includes an electrical current controller 364 that receives control signals from the temperature control logic 356. The amount of heat delivered to the heat transfer fluid is proportional to the difference between the set point temperature of the process component and the measured temperature. The heated heat transfer fluid is circulated between the process component and the remote temperature control module in order to heat the process component to the set point temperature.

What is claimed is:

1. A temperature control system for a semiconductor processing facility comprising:
a cooling unit for controlling the temperature of a cooling fluid; and
a plurality of remote temperature control modules in fluid communication with said cooling unit, each of said remote temperature control modules including:
a cooling fluid circulation loop for circulating said cooling fluid through said remote temperature control module, said cooling fluid circulation loop being in fluid communication with said cooling unit;
a heat transfer fluid circulation loop for circulating a heat transfer fluid through said remote temperature control module, said heat transfer fluid being in fluid communication with at least one process component of said semiconductor processing facility;
an integrated heat exchanger including a portion of the cooling fluid circulation loop, a portion of the heat transfer fluid circulation loop and an electrical heat source, the integrated heat exchanger exchanging heat between said cooling fluid that is circulated in said cooling fluid circulation loop and said heat transfer fluid that is circulated in said heat transfer fluid circulation loop,
a cooling fluid control valve in fluid communication with said cooling fluid circulation loop for controlling the circulation of said cooling fluid through said cooling fluid circulation loop; and
a controller programmed with a temperature control logic for controlling said cooling fluid valve and controlling said current controller.

2. The temperature control system of claim 1 wherein each of said remote temperature control modules includes the heat source in thermal communication with said heat transfer fluid for providing heat to said heat transfer fluid.

3. The temperature control system of claim 2 wherein said heat source is controlled by said temperature control logic in response to said temperature set point information and temperature feedback information related to said process component.

4. The temperature control system of claim 1 wherein said cooling unit is physically separate from said plurality of remote temperature control modules.

5. The temperature control system of claim 4 wherein said cooling unit is located in a utility basement of said semiconductor processing facility.

6. The temperature control system of claim 5 wherein said plurality of remote temperature control modules are located in a subfloor area of said semiconductor processing facility.

7. The temperature control system of claim 5 wherein said plurality of remote temperature control modules are physically connected to process tools within said semiconductor processing facility.

8. The temperature control system of claim 1 wherein each of said at least one process components has a set point temperature where said cooling unit is set to maintain said cooling fluid at a temperature correlating to a lowest temperature among all said process components that are thermally influenced by said cooling fluid.

9. A temperature control system for a process component of a semiconductor processing facility comprising:
a least one remote temperature control module, said remote temperature control module including;
a cooling fluid input for receiving cooling fluid from a cooling unit that serves multiple remote temperature control modules;
a cooling fluid output for returning cooling fluid to said cooling unit that serves multiple remote temperature control modules;
a cooling fluid circulation loop for circulating said cooling fluid through said remote temperature control module;
a heat transfer fluid input for receiving heat transfer fluid from the process component;
a heat transfer fluid output for returning said heat transfer fluid to said process component;
a heat transfer fluid circulation loop for circulating said heat transfer fluid through said remote temperature control module, said heat transfer fluid being in fluid communication with said process component of said semiconductor processing facility;
an integrated heat exchanger including a portion of the cooling fluid circulation loop, a portion of the heat transfer fluid circulation loop and an electrical heat source, the integrated heat exchanger exchanging heat between said cooling fluid that is circulated in said cooling fluid circulation loop and said heat transfer fluid that is circulated in said heat transfer fluid circulation loop, said electrical heat source being in thermal communication with a portion of said cooling fluid circulation loop and said heat transfer fluid circulation loop; a current controller being operably coupled with said electrical heat source;
a cooling fluid control valve in fluid communication with said cooling fluid circulation loop for controlling the circulation of said cooling fluid through said cooling fluid circulation loop; and
a controller programmed with a temperature control logic for controlling said cooling fluid control valve and controlling said current controller.

10. The temperature control system of claim 9 wherein each of said remote temperature control modules includes the heat source in thermal communication with said heat transfer fluid for providing heat to said heat transfer fluid.

11. The temperature control system of claim 10 wherein said heat source is controlled by said temperature control logic in response to temperature set point information and temperature feedback information related to said process component.

12. The temperature control system of claim 9 wherein said cooling unit is physically separate from said remote temperature control module and said multiple remote temperature control modules.

13. The temperature control system of claim 12 wherein said cooling unit is located in a utility basement of said semiconductor processing facility.

14. The temperature control system of claim 13 wherein said remote temperature control module is located in a subfloor area of said semiconductor processing facility.

15. The temperature control system of claim 13 wherein said remote temperature control module is physically connected to a process tool within said semiconductor processing facility.

16. The temperature control system of claim 9 wherein said cooling unit is set to maintain said cooling fluid at a temperature correlating to a lowest temperature among all of said at least one remote temperature control modules that are served by said cooling unit.

17. A temperature control system for a process component of a semiconductor processing facility comprising:
at least one remote temperature control module, said remote temperature control module including:
a cooling fluid input for receiving cooling fluid from a physically separate cooling unit that serves multiple remote temperature control modules;

a cooling fluid output for returning cooling fluid to said cooling unit that serves multiple remote temperature control modules;

a cooling fluid circulation loop for circulating said cooling fluid through said remote temperature control module;

a heat transfer fluid input for receiving heat transfer fluid from said process component;

a heat transfer fluid output for returning said heat transfer fluid to said process component;

a heat transfer fluid circulation loop for circulating said heat transfer fluid through said remote temperature control module, said heat transfer fluid being in fluid communication with said process component of said semiconductor processing facility, wherein said cooling fluid circulation loop and said heat transfer fluid circulation loop are separate fluid distribution systems;

an electrical heat source in thermal communication with said heat transfer fluid for providing heat to said heat transfer fluid;

an integrated heat exchanger for exchanging heat between said cooling fluid that is circulated in said cooling fluid circulation loop and said heat transfer fluid that is circulated in said heat transfer fluid circulation loop where the integrated heat exchanger includes a portion of the cooling fluid circulation loop, a portion of the heat transfer fluid circulation loop and the electrical heat source, said electrical heat source being in thermal communication with the portion of the cooling fluid loop and the portion of the heat transfer fluid circulation loop; a current controller being operably coupled to said electrical heat source.

a cooling fluid control valve in fluid communication with said cooling fluid circulation loop for controlling the circulation of said cooling fluid through said cooling fluid circulation loop; and a controller programmed with a temperature control logic for controlling said fluid control valve and controlling said current controller.

18. The temperature control system of claim 17 wherein said cooling unit is located in a utility basement of said semiconductor processing facility.

19. The temperature control system of claim 18 wherein said remote temperature is control module is located in a subfloor area of said semiconductor processing facility.

20. The temperature control system of claim 17 wherein said cooling unit is set to maintain said cooling fluid at a temperature correlating to a lowest temperature among all of said at least one remote temperature control modules that are served by said cooling unit.

* * * * *

UNITED STATES PATENT AND TRADEMARK OFFICE
CERTIFICATE OF CORRECTION

PATENT NO. : 7,069,984 B2
APPLICATION NO. : 09/780713
DATED : July 4, 2006
INVENTOR(S) : Boris Atlas It is certified that error appears in the above-identified patent and that said Letters Patent is hereby corrected as shown below:

On Title Page, should read,
Item [75] Inventor: Boris Atlas, San Jose, CA (US)

Signed and Sealed this

Thirtieth Day of January, 2007

JON W. DUDAS
*Director of the United States Patent and Trademark Office*